US006847256B2

United States Patent
Enguent

(10) Patent No.: US 6,847,256 B2
(45) Date of Patent: Jan. 25, 2005

(54) ELECTROMAGNETIC TRANSPONDER READER

(75) Inventor: Jean-Pierre Enguent, Saint Savournin (FR)

(73) Assignee: STMicroelectronics, S.A., Montrouge (FR)

( * ) Notice: Subject to any disclaimer, the term of this patent is extended or adjusted under 35 U.S.C. 154(b) by 39 days.

(21) Appl. No.: 10/454,119

(22) Filed: Jun. 4, 2003

(65) Prior Publication Data

US 2003/0227323 A1 Dec. 11, 2003

(30) Foreign Application Priority Data

Jun. 6, 2002 (FR) .......................................... 02 07000

(51) Int. Cl.[7] .............................................. H04Q 5/22
(52) U.S. Cl. .................... 329/358; 340/10.4; 340/10.1
(58) Field of Search ........................... 329/358; 340/10, 340/4, 10.1; 342/42; 455/337

(56) References Cited

U.S. PATENT DOCUMENTS

| 6,028,503 A | 2/2000 | Preishuberpflügl et al. |
| 6,181,198 B1 | 1/2001 | Poletto et al. |
| 6,636,146 B1 * | 10/2003 | Wehoski ..................... 340/10.4 |
| 6,650,226 B1 * | 11/2003 | Wuidart et al. ............ 340/10.1 |
| 2002/0011922 A1 * | 1/2002 | Wuidart ..................... 340/10.4 |

FOREIGN PATENT DOCUMENTS

EP  1 043 679 A1  10/2000

OTHER PUBLICATIONS

French Search Report from French Patent Application 02/07000, filed Jun. 4, 2002.

* cited by examiner

*Primary Examiner*—Robert Pascal
*Assistant Examiner*—Joseph Chang
(74) *Attorney, Agent, or Firm*—Lisa K. Jorgenson; James H. Morris; Wolf, Greenfield & Sacks, P.C.

(57) ABSTRACT

A method and a circuit for demodulating a signal transmitted by an electromagnetic transponder, including a sensor of a variable which is a function of the load formed by the transponder on an oscillating circuit, a phase demodulator and an amplitude demodulator at least functionally in parallel and receiving a signal coming from said sensor, a summer of the results provided by the demodulators, and a delay element in series with a first one of said demodulators, to compensate for a possible propagation time difference therebetween.

12 Claims, 2 Drawing Sheets

ELECTROMAGNETIC TRANSPONDER READER

BACKGROUND OF THE INVENTION

1. Field of the Invention

The present invention relates to systems using electromagnetic transponders, that is, transceivers (most often, mobile) capable of being interrogated in a contactless and wireless manner by a unit (generally fixed), called a read and/or write terminal. The present invention more generally relates to a read or read/write terminal of transponders which have no independent power supply. Such transponders extract the power supply required by the electronic circuits included therein from the high frequency field radiated by an antenna of the read/write terminal. The present invention applies to such terminals, be they terminals which only read the transponder data (for example, an electronic label), or read/write terminals, which are likely to modify data of the transponder (for example, a contactless smart card).

2. Discussion of the Related Art

Systems using electromagnetic transponders are based on the use of oscillating circuits including a winding forming an antenna, on the transponder side and on the read/write terminal side. These circuits are intended to be coupled by a close magnetic field when the transponder enters the field of the read/write terminal.

FIG. 1 very schematically shows a conventional example of a data exchange system between a read/write terminal 1 and a transponder 10.

Generally, terminal 1 is essentially formed of a series oscillating circuit formed of an inductance L1 in series with a capacitor C1 and a resistor R1, between an output terminal 2 of an amplifier or antenna coupler 3 and a reference terminal 4 (generally the ground). Antenna coupler 3 receives a high-frequency transmission signal generated by a modulator (not shown) belonging to a control and data exploitation circuit 5 comprising, among others, a modulator-demodulator and a microprocessor for processing the control signals and the data. Circuit 5 also comprises a quartz oscillator providing a high-frequency reference signal. This reference signal is, in some cases, used as the reference signal REF of a phase demodulator 6 ($\Delta\phi$) having the function of demodulating a possible data transmission originating from transponder 10. Signal REF may, instead of being extracted from circuit 5, that is, directly from the quartz oscillator, be sampled from output terminal 2 of antenna coupler 3 (dotted lines 9, FIG. 1).

Transponder 10 essentially includes a parallel oscillating circuit formed of an inductance L2, in parallel with a capacitor C2 between two input terminals 11, 12 of a control and processing circuit 13. Terminals 11 and 12 are, in practice, connected to the input of a rectifying means (not shown), the outputs of which form the D.C. power terminals of the circuits internal to the transponder. These circuits generally include, essentially, a microprocessor, a memory, a demodulator of the signals that may be received from terminal 1, and a modulator for transmitting information to the terminal.

In the absence of a data transmission from the terminal to the transponder, the high-frequency excitation signal is only used as a power source.

The possible transmission of information from the terminal to the transponder is performed, for example, by modulating the amplitude of the remote-supply carrier.

The transmission of information from transponder 10 to terminal 1 is generally performed by modifying the load of oscillating circuit L2, C2, so that the transponder takes more or less power from the high-frequency magnetic field. This variation is detected, on the side of terminal 1, insofar as the amplitude of the high-frequency excitation signal is maintained constant. Accordingly, a power variation of the transponder translates as an amplitude and phase variation of the current in antenna L1. This variation is then detected, for example, by means of phase demodulator 6 of terminal 1. For this purpose, for example, demodulator 6 receives a desired signal UTI originating from a current-to-voltage conversion by means of a resistor R3 between an input terminal of demodulator 6 and ground 4. Resistor R3 converts to voltage the current measured in oscillating circuit R1, L1, C1 by means, for example, of a current transformer 7 series-connected with the oscillating circuit. Current transformer 7 has been symbolized in FIG. 1 by two windings 7', 7". Primary winding 7' is in series with the oscillating circuit. Secondary winding 7" is connected by a first terminal to ground and by a second terminal to the input terminal of phase demodulator 6.

To transmit data from the transponder to the terminal, a modulation stage (not shown) of the transponder is controlled at a so-called sub-carrier frequency (for example, 847.5 kHz) much smaller (generally with a ratio of at least 10) than the frequency of the excitation signal of the terminal's oscillating circuit (for example, 13.56 MHz). The load variation on the transponder side is generally performed by means of an electronic switch for controlling a resistor or a capacitor modifying the load of oscillating circuit L2-C2. The electronic switch is controlled at the sub-carrier frequency to periodically submit the transponder's oscillating circuit to an additional damping with respect to the load formed by its exploitation circuits 13.

In the sub-carrier half-periods where the transponder's electronic switch is closed, demodulator 6 detects a slight phase shift (a few degrees, or even less than one degree) of the high-frequency carrier with respect to reference signal REF. Output 8 of demodulator 6 then gives back a signal which is an image of the control signal of the transponder's electronic switch, which can be decoded to restore the transmitted binary data.

A problem which arises with conventional read/write terminals using a phase demodulator is that the frequency response of the phase demodulator exhibits, when two oscillating circuits are tuned on the remote supply frequency (13.56 MHz), a zero (that is, the output voltage becomes zero) at a frequency of the signal to be demodulated corresponding to this remote supply frequency.

This phenomenon is illustrated in FIG. 2, which schematically shows the response of a phase demodulator 6. FIG. 2 shows the shape of voltage V8 at the output of demodulator 6 according to the frequency of the carrier on which the phase shift is detected. As illustrated in this drawing, the voltage becomes zero for a frequency f0 which corresponds, for a given coupling coefficient, to the resonance frequency of oscillating circuit L2-C2 of the transponder ($f=\frac{1}{2\pi\sqrt{LC}}$).

To solve this problem, the oscillating circuits are generally detuned so that the two oscillating circuits of the terminal and of the transponder are not both tuned on the frequency of the remote supply carrier.

However, a disadvantage resulting therefrom is that this adversely affects the transponder remote supply, and thus the system range. Indeed, the power received by the transponder is maximum when the two oscillating circuits of the terminal and of the transponder are both tuned on the carrier frequency.

Another problem is that the manufacturing tolerances of the capacitors used for oscillating circuits, in particular for capacitor C2 of the transponder, generally are on the order of 10%. Accordingly, the significance of these manufacturing tolerances results in having to, for security, slightly shift from frequency f0 of the carrier to guarantee a phase demodulation by the terminal.

Thus, a significant disadvantage of conventional systems is that a compromise must be made between the remote supply and the phase demodulation capacity of the terminal.

Further, this compromise is difficult to find since the position of the "gap" in the phase demodulator response varies according to the mutual inductance between oscillating circuits. This mutual inductance depends on the distance which separates antennas L1 and L2 from the terminal and the transponder, and thus on the relative position of the transponder with respect to the terminal upon transmission.

This variation is illustrated in FIG. 3, which shows, for several intervals between a transponder and a terminal, examples of voltage-vs.-frequency characteristics, where the voltage represents the remote supply voltage of the transponder, for example, voltage V2 across capacitor C2, and where f corresponds to the excitation frequency of the terminal's series oscillating circuit.

The different curves illustrated in FIG. 3 are drawn for oscillating circuits tuned on frequency f0, that is, oscillating circuits of the terminal and of the transponder which are both sized to have a resonance frequency corresponding to the remote supply carrier. Curves g1, g2, g3, g4, g5, and g6 indicate decreasing distances between the transponder and the terminal. In other words, curve g1 which exhibits a small dome centered on frequency f0 substantially corresponds to the system limiting range. The more the distance reduces, the more the peak formed by the voltage-vs.-frequency characteristic increases, as illustrated by curves g2, g3, and g4. Curve g4 illustrates the optimal coupling position, that is, the distance at which the coupling is optimized by a maximum remote supply amplitude received by the transponder at frequency f0. Short of this distance, if the transponder is brought closer still to terminal 1, the voltage amplitude exhibits a decrease (curve g5) which becomes stronger (curve g6) as the interval between inductances L1 and L2 decreases, voltage V2 then exhibiting maximum values for the frequencies surrounding frequency f0. As a result, by shifting the resonance frequency on which the oscillating circuits are sized with respect to the carrier frequency, the vertical operation axis of the system is displaced in the characteristic of FIG. 3 and, accordingly, the recovered remote supply voltage is decreased, at least for curves g1 to g4.

The combined problems of the phase gap in phase demodulators and of the variation of the position of this phase gap with respect to the distance between inductances, associated with the component manufacturing tolerances, make conventional systems unreliable.

A first solution would be to replace the phase demodulator with an amplitude demodulator. Indeed, the charge variation caused by the transponder on the terminal's oscillating circuit also translates as a slight amplitude variation which can then be detected by a measurement, either of the current in the terminal's oscillating circuit, or of the voltage across capacitor C1.

However, this solution only transposes the problem since the spectral response of an amplitude demodulator also exhibits a demodulation gap, that is, a frequency for which the voltage obtained at the demodulator output is zero. The significant variation of the resonance frequencies of oscillating circuits due to the capacitor manufacturing tolerances, associated with the significant variation of the position of the demodulation gap according to the coupling between oscillating circuits results in that, in practice, the use of an amplitude demodulator risks posing substantially the same problems as the use of a phase demodulator.

Document WO-A-9618969 describes a contactless transceiver system in which the reader uses both a phase demodulator and an amplitude demodulator, and selects the output signal exhibiting the best level.

However, the solution described in this document is not fully satisfactory. Indeed, it does not enable, in practice, modifying the choice between the phase demodulation and the amplitude demodulation, upon reception, since the signals demodulated by the two demodulators are not necessarily synchronous.

Further, the disadvantages linked to the manufacturing tolerances of oscillating circuits and their operation drift remain.

SUMMARY OF THE INVENTION

The present invention aims at providing a novel solution for solving the response problems of a phase demodulator and of an amplitude demodulator in charge of restoring data transmitted by a transponder.

The present invention more specifically aims at providing a solution which is implemented by the read/write terminal and which requires no modification of the transponder. In particular, the present invention aims at providing a solution that can operate with existing transponders.

The present invention also aims at providing a novel read/write terminal of an electromagnetic transponder in which the response of a demodulator to data transmitted by a transponder is optimized and made substantially independent from the resonance frequency of the oscillating circuits and from the carrier frequency.

The present invention also aims at providing a solution which is not sensitive to possible operation drifts of the transponders' resonant circuits.

The present invention also aims at providing a solution which gets rid of possible manufacturing dispersions of the oscillating circuits of the terminal and/or of the transponders.

The present invention further aims at providing a solution which optimizes the range of the transmission system.

To achieve these and other objects, the present invention provides a circuit for demodulating a signal transmitted by an electromagnetic transponder, comprising a sensor of a variable which is a function of the load formed by the transponder on an oscillating circuit, a phase demodulator and an amplitude demodulator at least functionally in parallel and receiving a signal coming from said sensor, a summer of the results provided by said demodulators, and a delay element in series with a first one of said demodulators, to compensate for a possible propagation time difference therebetween.

According to an embodiment of the present invention, the circuit further comprises a regulator of the delay introduced by said delay element according to the signal provided by said summer.

According to an embodiment of the present invention, said first demodulator to which the delay element is associated is the amplitude demodulator.

According to an embodiment of the present invention, said regulator comprises:

a rectifying element having its input connected to the summer output;

a comparator having a first input receiving the signal provided by said rectifying element and having a second input receiving a reference signal, the comparator output controlling said delay element.

According to an embodiment of the present invention, said delay element is formed of a controllable resistive element in series with said first demodulator, and of a capacitive element connecting a terminal of the resistive element to a reference voltage.

According to an embodiment of the present invention, said resistive element is formed of a field-effect transistor, a gate of which receives a regulation signal provided by said regulator and which conditions its series resistance.

According to an embodiment of the present invention, said demodulators, summer, delay element, and regulator are made in the form of a digital signal processor.

According to an embodiment of the present invention, said sensor measures the current in the oscillating circuit, or the voltage across one or several of its elements.

The present invention also provides a terminal of generation of an electromagnetic field capable of communicating with at least one transponder when said transponder enters this field.

The present invention further provides a method for demodulating a signal transmitted by an electromagnetic transponder, comprising:

measuring a variable which is a function of the load formed by the transponder on an oscillating circuit;

demodulating in phase the measured signal;

demodulating in amplitude the measured signal;

delaying a first result of at least one of the demodulations with respect to the other;

summing up the results of the two demodulations; and regulating the delay brought to said first demodulation result according to the result of the summation.

According to an embodiment of the present invention, the method is implemented by digital processing means.

According to an embodiment of the present invention, the method is implemented by analog circuits.

The foregoing objects, features and advantages of the present invention, will be discussed in detail in the following non-limiting description of specific embodiments in connection with the accompanying drawings.

DETAILED DESCRIPTION

Figure 1:
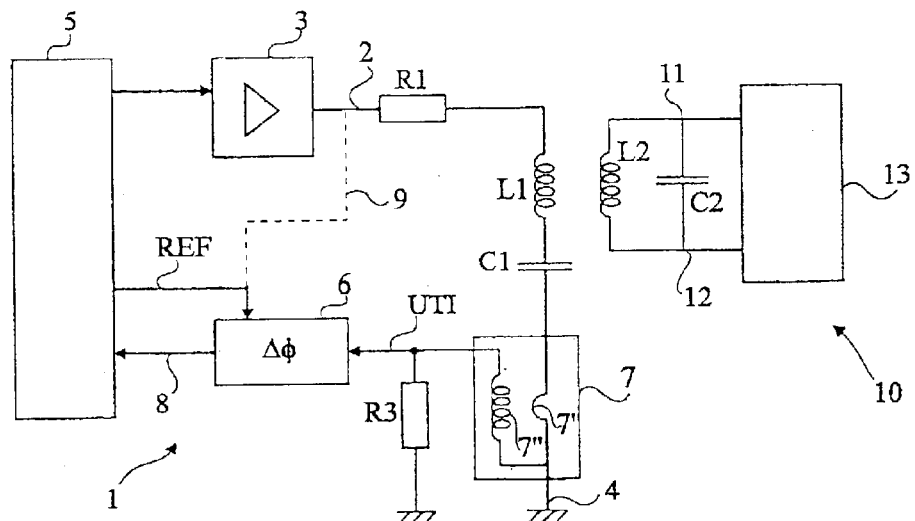
FIGS. 1 to 3, previously described, are intended to show the state of the art and the problem to solve.
Figure 2:
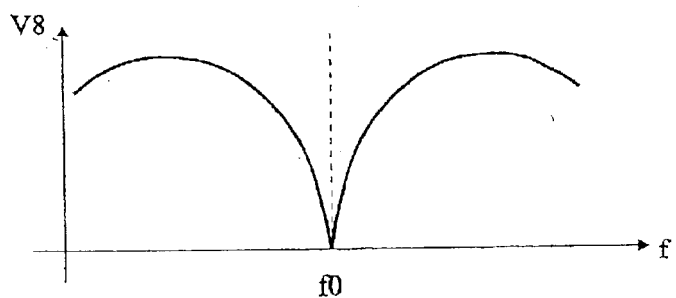
Figure 3:
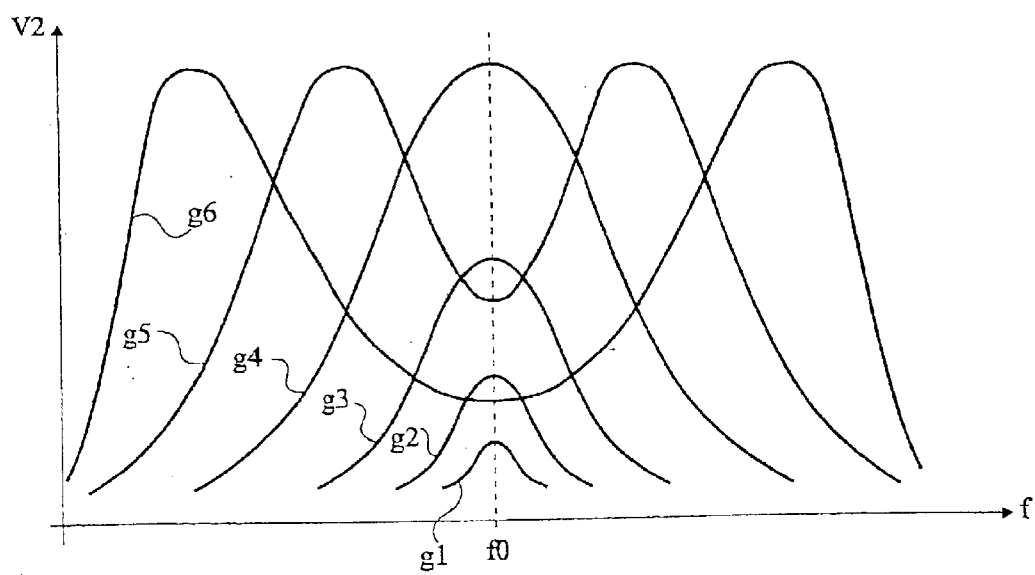

Same elements have been referred to with same references in the different drawings. For clarity, FIGS. 2, 3, 5, and 6 are not to scale. For clarity still, only those elements which are necessary to the understanding of the present invention have been shown in the drawings and will be described hereafter. In particular, the control, processing, and exploitation circuits of the terminal and of the transponder have not been detailed.

A feature of the present invention is to provide, within an electromagnetic transponder read/write terminal, a demodulation circuit which, to extract an image from the transponder's modulation circuit based on a measurement of the signal in the terminal's oscillating circuit, sums up the results of an amplitude demodulation and of a phase demodulation while delaying one of the two results with respect to the other. The delay enables solving problems of synchronization of the two demodulation results. Their sum can then be used, which is considerably simpler than a selection of one of the two results. Further, the difference between the propagation delays of the two demodulations is compensated for and problems linked to the manufacturing tolerances of the oscillating circuit components are avoided.

According to a preferred embodiment of the present invention, the delay brought to one of the demodulation results is controlled according to the signal provided at the demodulation circuit output. Such a control enables compensating for possible drifts in the resonance frequency of the terminal's oscillating circuit. The system range is thus optimized.

Figure 4:
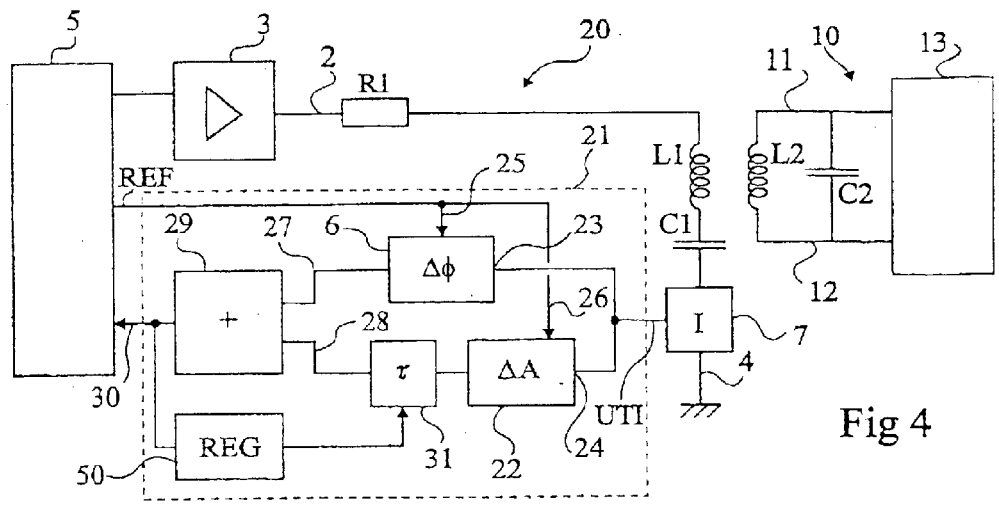
FIG. 4 very schematically shows an embodiment of a read/write terminal according to the present invention, associated with an electromagnetic transponder.

FIG. 4 schematically shows an embodiment of a read/write terminal 20 according to the present invention. In FIG. 4, terminal 20 has been shown as associated with a conventional transponder 10.

As previously, transponder 10 is essentially formed of a parallel oscillating circuit, formed of an inductance L2 in parallel with a capacitor C2 between two terminals 11, 12 of an exploitation and processing circuit 13.

As previously still, terminal 20 is based on a series oscillating circuit formed of a resistor R1, of an inductance L1, and of a capacitor C1. This oscillating circuit is connected in series with a current transformer 7 between an output terminal 2 of an amplifier or antenna coupler 3 and ground 4. Terminal 20 is controlled and exploited by a circuit 5 essentially gathering a microprocessor, a quartz oscillator, a modulator, and supply means. Current transformer 7 or any like other means for measuring the voltage or the current in the series oscillating circuit provides a signal UTI at the input of a demodulation circuit 21. This demodulation circuit receives, like a conventional circuit (FIG. 1), a reference signal REF (coming from circuit 5 or from terminal 2), signals UTI and REF being both at the remote supply carrier frequency. Circuit 21 comprises, in parallel, a phase demodulator 6 ($\Delta\phi$) and an amplitude demodulator 22 ($\Delta A$). Respective input terminals 23 and 24 of phase demodulator 6 and of amplitude demodulator 22 receive signal UTI to be measured. Respective reference terminals 25 and 26 of demodulators 6 and 22 receive reference signal REF. The respective structures of demodulator 6 and of demodulator 22 are conventional. An example of implementation will be described hereafter in relation with FIG. 7.

According to the present invention, the respective outputs 27, 28 of demodulators 6 and 22 are mixed in a summer 29, output 30 of which provides a signal which is an image of the modulation signal of transponder 10, that is, the result of the demodulation issued to circuit 5. Further, one of the demodulators is in series with a delay element 31 ($\tau$), for example, a delay line, to compensate for a possible propagation time shift between phase demodulator 6 and amplitude demodulator 22.

Preferably, delay element 31 is associated with the amplitude demodulator rather than with the phase demodulator. The forming of the phase demodulator is thus simplified. Indeed, the amplitude demodulator and the phase demodulator both comprise low-pass filters. However, the forming of a low-pass filter for a phase demodulator is often more difficult than for an amplitude demodulator. Accordingly, by transferring the delay line on the amplitude side, the introduction of an additional disturbance on the phase demodulation path is avoided.

Preferably, delay element 31 is settable and its set input is controlled by a regulator 50 (REG) in charge of controlling the delay by a reference value with respect to the (demodulated) output signal provided by summer 29. In fact, the reference value represents a level expected at output 30 of the summer.

Figure 5:
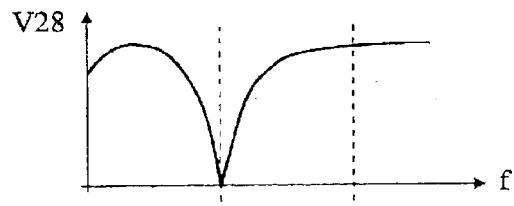
FIG. 5 illustrates the voltage-vs.-frequency characteristic of an amplitude demodulator.

FIG. 5 illustrates the voltage-vs.-frequency characteristic of an amplitude demodulator. As previously indicated, this characteristic exhibits, as with a phase demodulator, an operation gap of the amplitude demodulator (frequency f'0), that is, output voltage V28 (or V22) of the demodulator becomes zero or close to zero at a resonance frequency f'0 of circuit L1, C1.

Figure 6:
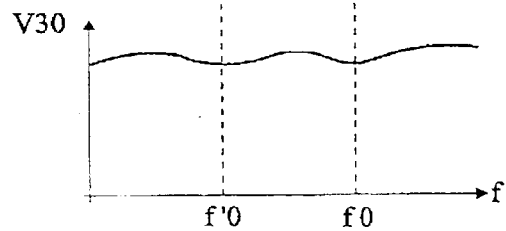
FIG. 6 illustrates the voltage-vs.-frequency characteristic of the demodulation circuit of the present invention.

However, for a given circuit, that is, for a given carrier frequency and for a given sizing of the components of the oscillating circuits associated with a given mutual inductance between these circuits, the demodulation gaps are at different frequencies for a phase demodulator (frequency f0) and for an amplitude demodulator (frequency f'0). Thus, by mixing the respective results obtained by the two demodulators, a voltage-vs.-frequency characteristic such as illustrated in FIG. 6 in which there is no more demodulation gap, that is, no more frequency for which voltage V30 at the output of circuit 21 becomes zero is obtained.

Figure 7:
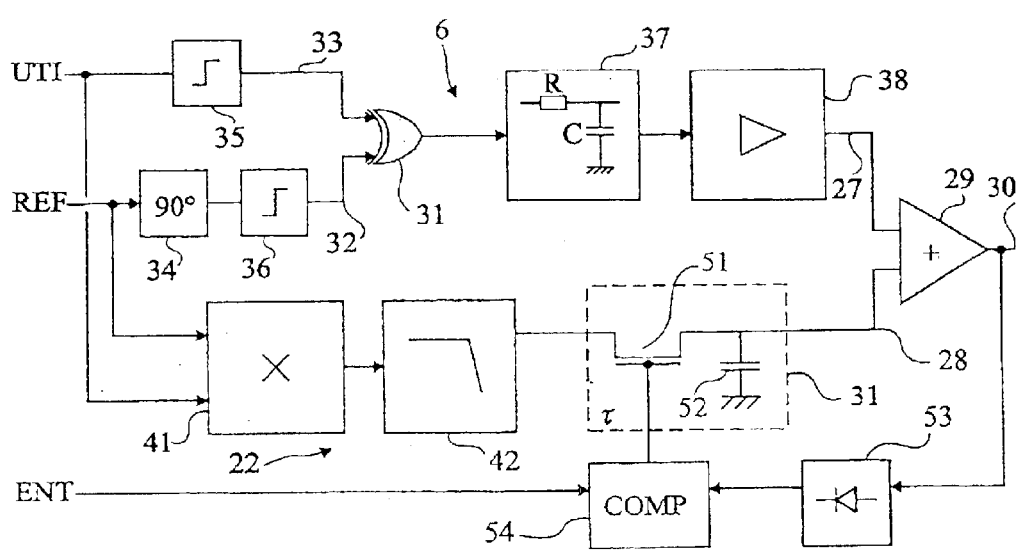
FIG. 7 shows, in the form of blocks, a more detailed embodiment of a demodulation circuit according to the present invention.

FIG. 7 shows, in the form of blocks, a preferred example of embodiment of a demodulation circuit 21 according to the present invention.

Phase demodulator 23 is, for example, based on the use of an XOR gate 31. Gate 31 receives, on a first input 32, a reference signal REF and, on a second input 33, a desired signal UTI. The input signals are of same frequency and shaped prior to inputs 32 and 33. In particular, these signals are phase-shifted by 90° with respect to each other in the quiescent state, that is, they are submitted to a basic phase shift of 90° in the absence of a phase modulation. In the example shown in FIG. 7, reference signal REF is phase shifted by 90° in a phase shifter 34. Further, the desired and reference signals are generally clamped in respective clamps 35 and 36 upstream of inputs 32 and 33. The output of gate 31 provides a signal of double frequency with respect to the frequency of signals UTI and REF. This output drives an averager 37 formed, for example, and in a simplified manner, of a resistor R and of a capacitor C. Averager 37 also forms a low-pass filter and is in series with an amplifier 38 to have, at output 27, an acceptable amplitude.

Amplitude demodulator 22 is, for example, based on a multiplier 41 receiving as inputs signals UTI and REF. The output of multiplier 41 is sent to a low-pass filter 42 forming the output of the actual amplitude demodulator. This output is sent onto the input of delay device 31 of the present invention.

Outputs 27 and 28 of the parallel phase and amplitude demodulation branches are summed up in a summer 29, output 30 of which provides the result of the demodulation.

According to the shown preferred embodiment, delay element 31 is formed of a field-effect transistor 51 (for example, a JFET transistor) and of a capacitive element 52. Transistor 51 connects the output of filter 42 to input 28 of summer 29 (or to output 28 of the amplitude demodulation branch). Capacitor 52 connects terminal 28 to ground. The gate of transistor 51 forms the set input terminal of delay element 31. A resistive and capacitive cell, the time constant of which is made settable by a modification of the series resistance of transistor 51 in the on state, is thus formed.

Regulator 50 is, for example, formed of a rectifying element 53 having its input connected to output 30 of summer 29 and its output connected to a first input of a comparator 54 (COMP). The second input of comparator 54 receives a predetermined reference signal ENT. Comparator 54 provides a signal (analog) varying the gate voltage of transistor 51 to modify the series resistance thereof. Transistor 51 is thus controlled in linear mode. The function of rectifier 53 is to convert the (approximately sinusoidal) output signal of summer 30 into a D.C. level representing its RMS value to be compared to reference level ENT. The rectifier is preferentially fullwave for rapidity reasons.

Reference signal ENT is determined empirically according to the expected operating frequency variations, to guarantee that the control signal of transistor 51 places said transistor in a correct delay range.

Other delay element structures may be envisaged. For example, a switchable resistor network may be used to modify the delay.

An advantage of the present invention is that demodulation circuit 21 no longer exhibits a demodulation gap. This result is achieved without it being necessary to intervene on the phase and amplitude demodulators. Indeed, according to the present invention, the presence of a demodulation gap in the amplitude and phase demodulator spectrum no longer matters. If the system is in a configuration where one of the phase or amplitude demodulators provides too low a signal, the other demodulator will then provide a correct result.

Another advantage of the present invention is that it is independent from the transponder. Thus, it is not necessary to modify existing transponders to have them operate with a read/write terminal according to the present invention.

Another advantage of the present invention is that, even on the read/write terminal side, the modifications required with respect to a conventional terminal are limited. In particular, the present invention requires no input/output change with respect to a conventional demodulator. Indeed, circuit 21 of the present invention requires, like a conventional phase demodulator, a reference signal input, a desired signal input, and an output providing the demodulation result. Only reference input ENT of the regulator must, according to the preferred embodiment, be added.

Another advantage of the present invention is that by regulating the delay, an optimal level is ensured at the demodulation circuit output. The system range is thus optimized despite possible drifts in operation of the frequency of the terminal's oscillating circuit.

Of course, the present invention is likely to have various alterations, modifications, and improvements which will readily occur to those skilled in the art. In particular, the practical forming of the demodulation circuit of the present invention is within the abilities of those skilled in the art according to the application and to the functional indications given hereabove. Further, it should be noted that other types of phase and amplitude demodulators may be used provided to respect the (at least functional) use of a delay line on one of the demodulation branches in parallel to compensate for possible propagation time differences in the branches. For example, an amplitude demodulator may be based on a peak detection. Further, although the present invention has been described hereabove in relation with a measurement of the signal in the terminal's oscillating circuit by means of an current transformer, other measurement means may be used, for example, a voltage measurement across capacitor C1.

Finally, although the present invention has been described in relation with an embodiment assuming an analog implementation of the elements, it may be implemented by digital means, for example, by means of a digital signal processor (DSP), or even by software.

Among the applications of the present invention, are readers (for example, access control terminals or porticoes, automatic vending machines, computer terminals, telephone terminals, television sets, or satellite decoders, etc.) of contactless smart cards (for example, identification cards for access control, electronic purse cards, cards for storing information about the card holder, consumer fidelity cards, toll television cards, etc.).

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A circuit for demodulating a signal transmitted by an electromagnetic transponder, comprising:
   a sensor of a variable which is a function of the load formed by the transponder on an oscillating circuit;
   a phase demodulator and an amplitude demodulator at least functionally in parallel and receiving a signal coming from said sensor;
   a summer of the results provided by said demodulators; and
   a delay element in series with a first one of said demodulators, to compensate for a possible propagation time difference therebetween.

2. The circuit of claim 1, further comprising a regulator of the delay introduced by said delay element according to the signal provided by said summer.

3. The circuit of claim 1, wherein said first demodulator to which the delay element is associated is the amplitude demodulator.

4. The circuit of claim 1, wherein said regulator comprises:
   a rectifying element having its input connected to the summer output;
   a comparator having a first input receiving the signal provided by said rectifying element and having a second input receiving a reference signal, the comparator output controlling said delay element.

5. The circuit of claim 1, wherein said delay element is formed of a controllable resistive element in series with said first demodulator, and of a capacitive element connecting a terminal of the resistive element to a reference voltage.

6. The circuit of claim 5, wherein said resistive element is formed of a field-effect transistor, a gate of which receives a regulation signal provided by said regulator and which conditions its series resistance.

7. The circuit of claim 1, wherein said demodulators, summer, delay element, and regulator are made in the form of a digital signal processor.

8. The circuit of claim 1, wherein said sensor measures the current in the oscillating circuit, or the voltage across one or several of its elements.

9. A terminal of generation of an electromagnetic field capable of communicating with at least one transponder when said transponder enters this field, comprising the demodulation circuit of claim 1.

10. A method for demodulating a signal transmitted by an electromagnetic transponder, comprising:
    measuring a variable which is a function of the load formed by the transponder on an oscillating circuit;
    demodulating in phase the measured signal;
    demodulating in amplitude the measured signal;
    delaying a first result of at least one of the demodulations with respect to the other;
    summing up the results of the two demodulations; and
    regulating the delay brought to said first demodulation result according to the result of the sum integration.

11. The method of claim 10, implemented by digital processing means.

12. The method of claim 10, implemented by analog circuits.

* * * * *